(12) United States Patent
Oh

(10) Patent No.: US 11,506,705 B2
(45) Date of Patent: Nov. 22, 2022

(54) TEST SOCKET AND TEST APPARATUS HAVING THE SAME

(71) Applicant: TSE CO., LTD., Chungcheongnam-do (KR)

(72) Inventor: Chang Su Oh, Chungcheongnam-do (KR)

(73) Assignee: TSE CO., LTD., Chungcheongnam-do (KR)

( * ) Notice: Subject to any disclaimer, the term of this patent is extended or adjusted under 35 U.S.C. 154(b) by 0 days.

(21) Appl. No.: 17/468,341

(22) Filed: Sep. 7, 2021

(65) Prior Publication Data

US 2022/0099730 A1  Mar. 31, 2022

(30) Foreign Application Priority Data

Sep. 25, 2020 (KR) .................. 10-2020-0124894

(51) Int. Cl.
*G01R 31/28* (2006.01)
*G01R 1/04* (2006.01)

(52) U.S. Cl.
CPC ....... *G01R 31/2863* (2013.01); *G01R 1/0466* (2013.01)

(58) Field of Classification Search
CPC .............. G01R 31/2863; G01R 1/0466
See application file for complete search history.

(56) References Cited

U.S. PATENT DOCUMENTS

2001/0016435 A1\* 8/2001 Fujimura ............. G01R 1/0483
439/71
2012/0169367 A1\* 7/2012 Kuo ................... G01R 31/2889
324/756.03

FOREIGN PATENT DOCUMENTS

KR  10-2006-0062824  6/2006

OTHER PUBLICATIONS

English Translation of KR20170058677A, by In Chin Hun (Year: 2017).\*

\* cited by examiner

*Primary Examiner* — Paresh Patel

(57) ABSTRACT

The present disclosure discloses a test socket according to the present disclosure including an inelastic electro-conductive housing formed of an inelastic electro-conductive material and provided with a plurality of housing holes passing therethrough in the thickness direction, each housing hole being formed at a position corresponding to each terminal of a device under test; and an electro-conductive part formed to have a configuration in which a plurality of electro-conductive particles are oriented in the thickness direction in an elastic insulating material, and comprising an electro-conductive part for grounding, an electro-conductive part for signal, and an electro-conductive part for power disposed in the housing holes, respectively, the electro-conductive part for signal and the electro-conductive part for power being insulated by an insulating layer.

20 Claims, 6 Drawing Sheets

TEST SOCKET AND TEST APPARATUS HAVING THE SAME

CROSS-REFERENCE TO RELATED APPLICATION

This application claims priority of Korean Patent Application No. 10-2020-0124894, filed on Sep. 25, 2020, in the KIPO (Korean Intellectual Property Office), the disclosure of which is incorporated herein entirely by reference.

BACKGROUND OF THE INVENTION

Field of the Invention

The present disclosure relates to a test socket, and more particularly to a test socket configured to electrically connect a device under test and a tester to each other, and a test apparatus including the same.

Description of the Related Art

A device under test (for example, a semiconductor package) is formed by integrating fine electronic circuits at a high density, and during a manufacturing process, a test process for the device under test is performed to check whether each electronic circuit is normal. The test process is a process for testing whether the device under test is being normally operated to select normal products and defective products.

For testing the device under test, a test apparatus configured to electrically connect a terminal of the device under test and a pad of a tester applying a test signal to each other is utilized. The test apparatus has various configurations depending on the type of the device under test to be tested. The test apparatus and the device under test are not directly connected to each other, but indirectly connected through a test socket.

Typically, a pogo socket and a rubber socket have been used as the test socket. Among them, the rubber socket has a configuration in which electro-conductive parts, each of which being formed to have a configuration in which a plurality of electro-conductive particles are contained in a material having elasticity such as silicon, are arranged to be insulated from each other inside an insulating part formed of a material having elasticity such as silicon. Since the above-mentioned a rubber socket does not use a mechanical means, such as soldering or a spring, it has excellent durability, can achieve a simple electrical connection, and has the advantage of being capable of implementing a short electro-conductive path, and has thus been widely used in recent year.

In the test apparatus including the rubber socket type test socket, the amount of contact stroke of the test socket is determined depending on a stroke limiting part located at a periphery of a pressurizing part of a pusher pressurizing the device under test, a vertical thickness of a stopper part located at a periphery an electro-conductive part of the test socket, a thickness of the device under test, a height of the test socket, and the like.

However, the conventional test apparatus had difficulty in precise stroke control due to an addition of a thickness tolerance of the stroke limiting part, a thickness tolerance of the stopper part, a height tolerance of the test socket, and a thickness tolerance of the device under test.

In addition, although the conventional rubber socket type test socket implements a short electro-conductive path, the insulating part is made of a non-electro-conductive material, high-frequency signal interference between the electro-conductive parts cannot be avoided. Furthermore, recently, as the density of electro-conductive parts is increased and a pitch therebetween is decreased, signal loss is further increasing. However, there is no proper means for inhibiting this phenomenon, so there is a problem in that a high-frequency signal transmission characteristic is deteriorated.

The above-described information disclosed in the background description is provided only for improving the understanding of the background of the present disclosure, and thus may include the information which does not constitute the prior art.

SUMMARY OF THE INVENTION

The present disclosure is conceived in the light of the above problems, and an object of the present disclosure is to provide a test socket having less difficulty in stroke control caused by a thickness tolerance of a device under test and the like, being capable of precisely controlling the stroke, and having excellent high-frequency signal transmission characteristic, and a test apparatus including the same.

In order to achieve the above object, a test socket according to one aspect of the present disclosure may include an inelastic electro-conductive housing formed of an inelastic electro-conductive material and provided with a plurality of housing holes passing therethrough in the thickness direction, each housing hole being formed at a position corresponding to each terminal of a device under test; and an electro-conductive part formed to have a configuration in which a plurality of electro-conductive particles are oriented in the thickness direction in an elastic insulating material, and comprising an electro-conductive part for grounding, an electro-conductive part for signal, and an electro-conductive part for power disposed in the housing holes, respectively, the electro-conductive part for signal and the electro-conductive part for power being insulated by an insulating layer, wherein a ground-connecting end part is provided in the housing hole in which the electro-conductive part for grounding is disposed, provided between an upper and lower end portions of the housing hole, and formed by protruding the inelastic electro-conductive housing from an inner wall forming the housing hole.

The ground-connecting end may have a plate shape extending towards a center of the housing hole.

The ground-connecting end part may have a plate shape traversing the housing hole.

The ground-connecting end part traversing the housing hole may have a through hole formed at a center thereof.

An upper surface of the ground-connecting end part may be formed as an upper inclined surface inclined downward from an inner wall of the inelastic electro-conductive housing forming the housing hole.

A lower surface of the ground-connecting end part may be formed as a lower inclined surface inclined upward from an inner wall of the inelastic electro-conductive housing forming the housing hole.

An upper surface of the ground-connecting end part may be formed as an upper inclined surface inclined downward from an inner wall of the inelastic electro-conductive housing forming the housing hole, and a lower surface of the ground-connecting end part may be formed as a lower inclined surface inclined upward from an inner wall of the inelastic electro-conductive housing forming the housing hole.

The insulating layers may be formed on upper and lower surfaces of the inelastic electro-conductive housing, respectively.

In order to achieve the above object, a test socket according to another aspect of the present disclosure may include an inelastic electro-conductive housing formed of an inelastic electro-conductive material and provided with a plurality of housing holes passing therethrough in the thickness direction, each housing hole being formed at a position corresponding to each terminal of a device under test; an upper insulating sheet and a lower insulating sheet coupled to upper surface and lower surface of the inelastic electro-conductive housing, respectively, each of the upper insulating sheet and the lower insulating sheet having an insulation sheet hole formed therein and corresponding to the housing hole; and an electro-conductive part formed to have a configuration in which a plurality of electro-conductive particles are oriented in the thickness direction in an elastic insulating material, and comprising an electro-conductive part for grounding passing through and disposed in the housing hole and insulation sheet hole, and an electro-conductive part for signal and an electro-conductive part for power passing through and disposed in the housing hole and insulation sheet hole in which insulating parts are formed; wherein a ground-connecting end part is provided in the housing hole in which the electro-conductive part for grounding is disposed, and formed by protruding the inelastic electro-conductive housing from an inner wall forming the housing hole.

The ground-connecting end part may be formed at a position adjacent to an upper end portion of the housing hole.

The ground-connecting end part may be formed at a position adjacent to a lower end portion of the housing hole.

The insulating part may be made of an elastic insulating material.

A ground terminal connected to the inelastic electro-conductive housing may be disposed on a lower surface of the inelastic electro-conductive housing.

The ground terminal may be formed to have a configuration in which a plurality of electro-conductive particles are contained in an elastic insulating material.

Meanwhile, in order to achieve the above object, a test apparatus according to one aspect of the present disclosure is configured to connect a device under test having a terminal to a tester generating a test signal so as to test the device under test, and may include a test socket configured to electrically connect the tester and the device under test to each other so to enable the test signal of the tester to be transmitted the device under test; and a pusher configured to be moved towards the tester or away from the tester so as to provide a pressurizing force by which the device under test placed on the test socket can be pressurized toward the tester. Here, the test socket may include an inelastic electro-conductive housing formed of an inelastic electro-conductive material and provided with a plurality of housing holes passing therethrough in the thickness direction, each housing hole being formed at a position corresponding to each terminal of a device under test; insulating layers formed on upper and lower surfaces of the inelastic electro-conductive housing, respectively, and an electro-conductive part formed to have a configuration in which a plurality of electro-conductive particles are oriented in the thickness direction in an elastic insulating material, and comprising an electro-conductive part for grounding, an electro-conductive part for signal, and an electro-conductive part for power disposed in the housing holes, respectively, the electro-conductive part for signal and the electro-conductive part for power being insulated by an insulating layer, wherein a ground-connecting end part may be provided in the housing hole in which the electro-conductive part for grounding is disposed, provided between an upper and lower end portions of the housing hole, and formed by protruding the inelastic electro-conductive housing from an inner wall forming the housing hole.

On the other hand, in order to achieve the above object, a test apparatus according to another aspect of the present disclosure is configured to connect a device under test having a terminal to a tester generating a test signal so as to test the device under test, and may include a test socket configured to electrically connect the tester and the device under test to each other so to enable the test signal of the tester to be transmitted the device under test; and a pusher configured to be moved towards the tester or away from the tester so as to provide a pressurizing force by which the device under test placed on the test socket can be pressurized toward the tester. Here, the test socket may include an inelastic electro-conductive housing formed of an inelastic electro-conductive material and provided with a plurality of housing holes passing therethrough in the thickness direction, each housing hole being formed at a position corresponding to each terminal of a device under test; an upper insulating sheet and a lower insulating sheet coupled to upper surface and lower surface of the inelastic electro-conductive housing, respectively, each of the upper insulating sheet and the lower insulating sheet having an insulation sheet hole formed therein and corresponding to the housing hole; and an electro-conductive part formed to have a configuration in which a plurality of electro-conductive particles are oriented in the thickness direction in an elastic insulating material, and comprising an electro-conductive part for grounding passing through and disposed in the housing hole and insulation sheet hole, and an electro-conductive part for signal and an electro-conductive part for power passing through and disposed in the housing hole and insulation sheet hole in which insulating parts are formed; wherein a ground-connecting end part may be provided in the housing hole in which the electro-conductive part for grounding is disposed, and formed by protruding the inelastic electro-conductive housing from an inner wall forming the housing hole.

The test apparatus according to the present disclosure electrically connects the tester to the device under test using a test socket including the inelastic electro-conductive housing made of an inelastic electro-conductive material and supporting a plurality of electro-conductive parts, so that the pressurizing force of the pusher can be applied evenly between the device under test and the test socket and between the test socket and the tester.

Also, in the test apparatus according to the present disclosure, since the inelastic electro-conductive housing made of an inelastic electro-conductive material serves as a stopper, like a conventional technique utilizing a rubber socket type test socket, difficulty in stroke control due to a thickness tolerance of a stroke limiting part, a thickness tolerance of a stopper part of the test socket, a height tolerance of the test socket, a thickness tolerance of the device under test, or the like is reduced, and it is possible to precisely control of the stroke.

In addition, the test socket according to the present disclosure has a coaxial cable structure because the insulating part surrounds the electro-conductive part for transmitting a signal and the inelastic electro-conductive housing surrounds the insulating part. Accordingly, the high frequency signal transmission characteristic is excellent and the high frequency signal interference between the electro-conductive parts is small, so the signal transmission loss can be minimized.

Furthermore, the test socket according to the present disclosure is advantageous for high-speed signal transmission because characteristic impedance matching is possible by adjusting the diameter of the electro-conductive part or a distance between the electro-conductive part and the inelastic electro-conductive housing.

In addition, the test socket according to the present disclosure has more improved high-frequency signal transmission and power supply characteristics because the electro-conductive part for grounding comes into direct contact with the ground-connecting part protruding from the inelastic electro-conductive housing made of a metal material.

BRIEF DESCRIPTION OF THE DRAWINGS

The above and other features and advantages will become more apparent to those of ordinary skill in the art by describing in detail exemplary embodiments with reference to the attached drawings, in which.

In the following description, the same or similar elements are labeled with the same or similar reference numbers.

DETAILED DESCRIPTION

Figure 1:
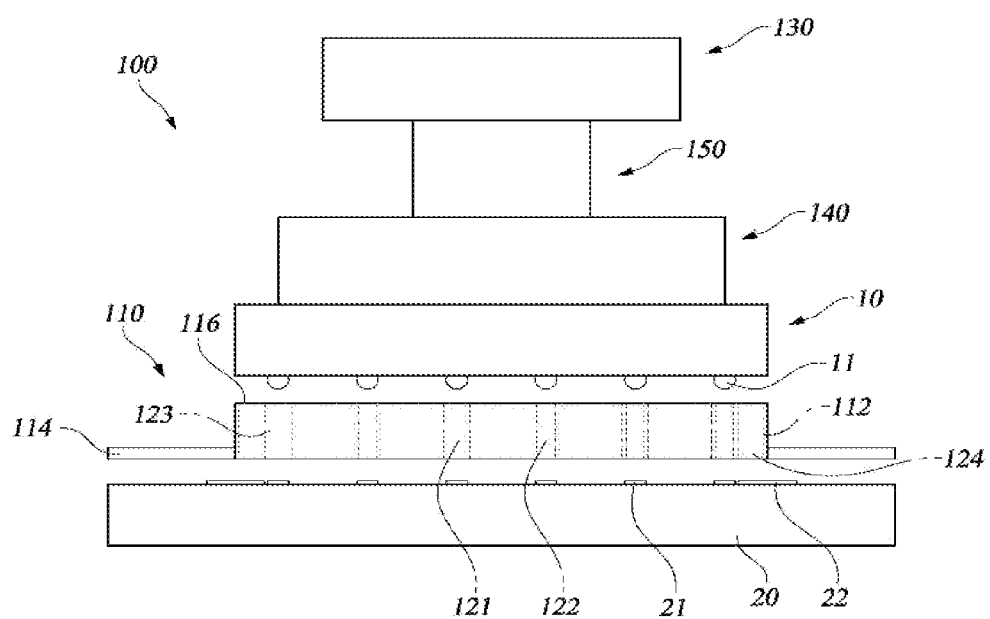
FIG. 1 is a front view illustrating a test apparatus according to one embodiment of the present disclosure.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "includes", "comprises" and/or "comprising," when used in this specification, specify the presence of stated features, integers, steps, operations, elements, and/or components, but do not preclude the presence or addition of one or more other features, integers, steps, operations, elements, components, and/or groups thereof. In addition, a term such as a "unit", a "module", a "block" or like, when used in the specification, represents a unit that processes at least one function or operation, and the unit or the like may be implemented by hardware or software or a combination of hardware and software.

Reference herein to a layer formed "on" a substrate or other layer refers to a layer formed directly on top of the substrate or other layer or to an intermediate layer or intermediate layers formed on the substrate or other layer. It will also be understood by those skilled in the art that structures or shapes that are "adjacent" to other structures or shapes may have portions that overlap or are disposed below the adjacent features.

In this specification, the relative terms, such as "below", "above", "upper", "lower", "horizontal", and "vertical", may be used to describe the relationship of one component, layer, or region to another component, layer, or region, as shown in the accompanying drawings. It is to be understood that these terms are intended to encompass not only the directions indicated in the figures, but also the other directions of the elements.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Preferred embodiments will now be described more fully hereinafter with reference to the accompanying drawings. However, they may be embodied in different forms and should not be construed as limited to the embodiments set forth herein. Rather, these embodiments are provided so that this disclosure will be thorough and complete, and will fully convey the scope of the disclosure to those skilled in the art.

Hereinafter, a test socket according to a preferred embodiment of the present disclosure, and a test apparatus including the same will be described in detail with reference to the accompanying drawings. At this time, it should be noted that in the accompanying drawings, the same components are denoted by the same reference numerals, if possible.

Figure 2:
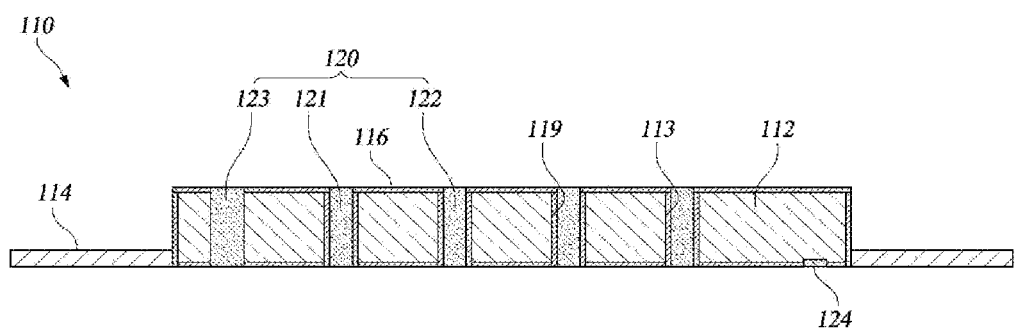
FIG. 2 is a front sectional view illustrating a test socket provided in the test apparatus according to one embodiment of the present disclosure.
Figure 3:
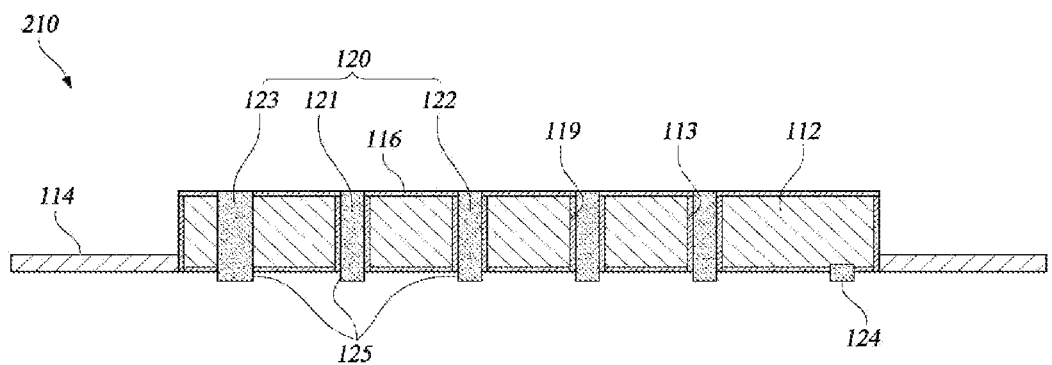
FIGS. 3 to 6 are front cross-sectional views illustrating a test socket provided in a test apparatus according to another embodiment of the present disclosure.
Figure 4:
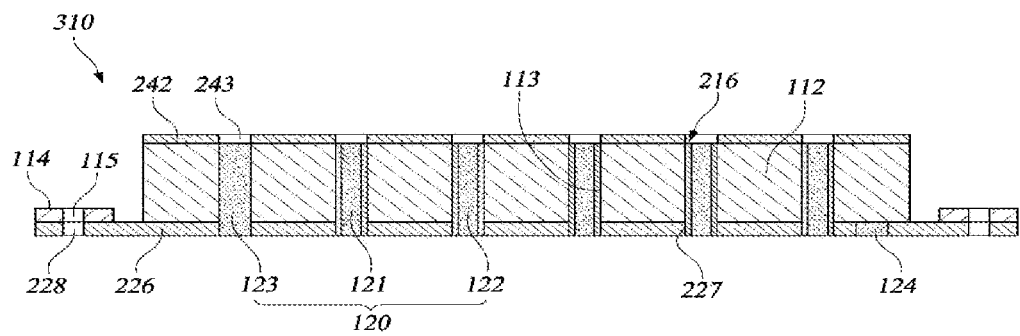
Figure 7:
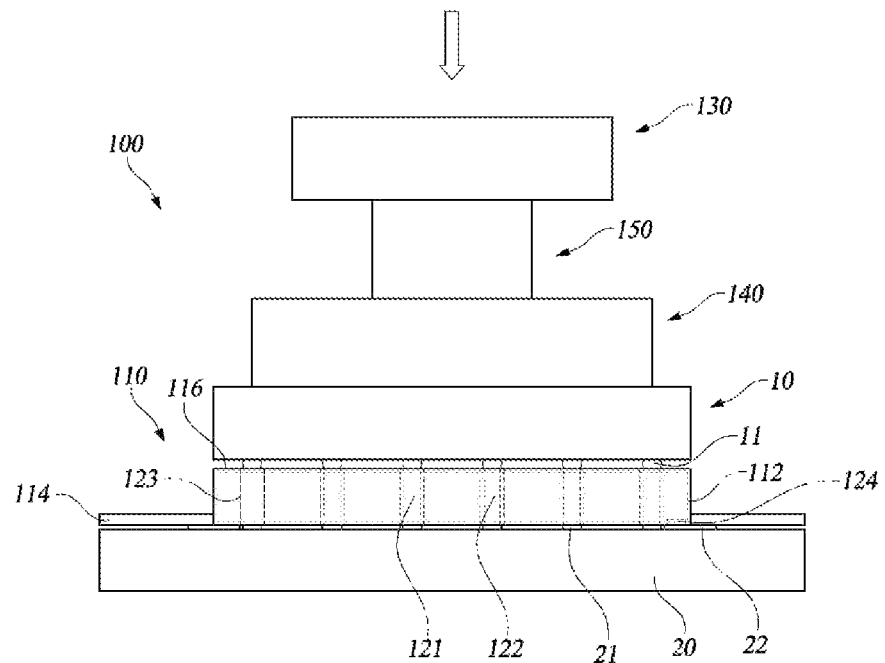
FIG. 7 is a view for explaining operation of the test apparatus according to one embodiment of the present disclosure.
Figure 8:
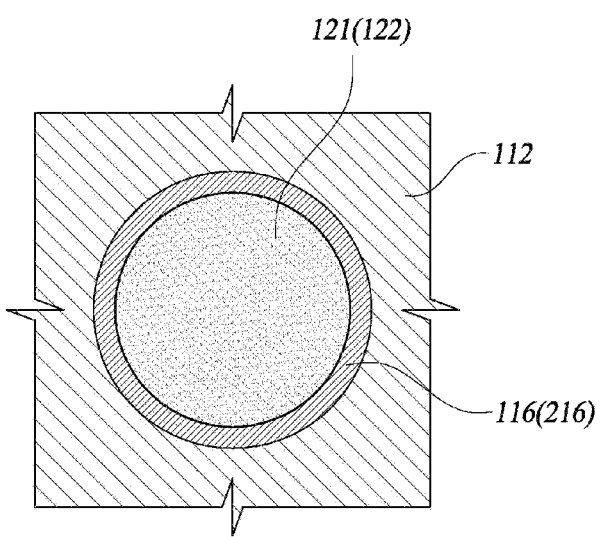
FIG. 8 is a plan cross-sectional view illustrating a part of the test socket provided in the test apparatus according to one embodiment of the present disclosure.

FIG. 1 is a front view illustrating a test apparatus according to one embodiment of the present disclosure, FIG. 2 is a front sectional view illustrating a test socket provided in the test apparatus according to one embodiment of the present disclosure, FIGS. 3 to 6 are front cross-sectional views illustrating a test socket provided in a test apparatus according to another embodiment of the present disclosure, FIG. 7 is a view for explaining operation of the test apparatus according to one embodiment of the present disclosure, and FIG. 8 is a plan cross-sectional view illustrating a part of the test socket provided in the test apparatus according to one embodiment of the present disclosure.

As illustrated in the drawings, a test apparatus 100 provided with a first test socket 110 according to one embodiment of the present disclosure is an apparatus configured to connect a device 10 under inspection having a terminal 11 to a tester 20 generating a test signal to test device 10 under inspection, and includes a first test socket 110 electrically connecting the tester 20 and the device 10 under inspection to each other and a pusher 130 configured to pressurize the device 10 under inspection placed on the first test socket 110 towards the tester 20.

The first test socket 110 may include an inelastic electro-conductive housing 112 having a plurality of housing holes 113 formed therein, an insulating layer 116 formed on the inelastic electro-conductive housing 112 around the housing hole 113, a plurality of electro-conductive parts 120 disposed in the plurality of housing holes 113, respectively, so as to pass through the inelastic electro-conductive housing 112 in the thickness direction, and a ground terminal 124 disposed on a lower surface of the inelastic electro-conductive housing 112.

The electro-conductive part 120 includes an electro-conductive part 121 for signal configured to transmit a plurality of signals, an electro-conductive part 122 for power configured to supply the power, and an electro-conductive part 123 for grounding configured to ground the test socket. In this specification, when referring to each of these electro-conductive parts, they are divided into and denoted as the electro-conductive parts for signal, power, or grounding, and when collectively referring to them, they are denoted as the electro-conductive part 120.

The inelastic electro-conductive housing 112 is made of an inelastic electro-conductive material. As the inelastic electro-conductive material constituting the inelastic electro-conductive housing 112, an electro-conductive metal such as aluminum, copper, brass, SUS, iron, or nickel, or various materials having electro-conductivity and inelastic properties may be used. The plurality of housing holes 113 formed in the inelastic electro-conductive housing 112 are formed to pass through the inelastic electro-conductive housing 112 in the thickness direction. As illustrated, a support frame 114 may be coupled to the inelastic electro-conductive housing 112.

In the inelastic electro-conductive housing 112, the insulating layers 116 are formed on inner walls forming the housing holes 113 in which the electro-conductive part 121 for signal and the electro-conductive part 122 for power are formed, respectively. An insulating layer hole 119 which is parallel with the housing hole 113 is provided in the insulating layer 116 formed around the housing holes 113.

However, the insulating layer 116 is not formed around the housing hole 113 in which the electro-conductive part 123 for grounding is formed. This is to improve the grounding function of the electro-conductive part 123 for grounding by allowing the electro-conductive part 123 for grounding to directly make contact with the inelastic electro-conductive housing 112.

The insulating layer 116 may also be formed on upper and lower surfaces of the inelastic electro-conductive housing 112. The insulating layer 116 disposed on the upper surface of the inelastic electro-conductive housing 112 may electrically insulate the inelastic electro-conductive housing 112 from the device 10 under inspection placed on the inelastic electro-conductive housing 112, and the insulating layer 116 disposed on the lower surface of the inelastic electro-conductive housing 112 electrically insulates the tester 20 from the inelastic electro-conductive housing 112. In addition, the insulating layer 116 formed on the inner walls forming the housing holes 113 of the inelastic electro-conductive housing 112 electrically insulates the electro-conductive part 121 for signal and the electro-conductive part 122 for power disposed in the housing holes 113 from the inelastic electro-conductive housing 112.

Such the insulating layer 116 may be formed as an insulating coating layer coated on the inelastic electro-conductive housing 112 in the form of a thin film with an even thickness. When the insulating layer 116 is formed as the insulating coating layer, the inelastic electro-conductive housing 112 may be coated with the insulating layer 116 by a coating method selected from a paraline coating, an anodizing processing, a Teflon coating, and a liquefied silicone coating.

The electro-conductive part 120 may be formed in a form in which a plurality of electro-conductive particles are contained in an elastic insulating material such that it is connected to a pad 21 of the tester 20 and the terminal 11 of the device 10 under inspection. The electro-conductive part 120 has a column shape, and its cross-section may be formed in various other shapes such as a circle, a rectangle, a polygonal, and the like. As the electro-conductive particles constituting the electro-conductive part 120, regular shaped electro-conductive particles having a predetermined uniform shape and irregular shaped electro-conductive particles having a randomly uneven shape may be employed.

Each of the electro-conductive part 121 for signal and the electro-conductive part 122 for power is disposed in the insulating layer hole 119 to pass through the inelastic electro-conductive housing 112 in the thickness direction. The electro-conductive part 121 for signal and the electro-conductive part 122 for power come into contact with the insulating layer 116 disposed on the inner wall forming the housing holes 113, and are electrically insulated from the inelastic electro-conductive housing 112 by the insulating layer 116.

On the other hand, the electro-conductive part 123 for grounding is disposed so as to come directly into contact with the inelastic electro-conductive housing 112 having electro-conductivity and having no insulating layer formed on the inner wall forming the corresponding housing hole, it is thus electrically connected to the inelastic electro-conductive housing 112.

Since the electro-conductive part 120 is placed in the housing hole 113 and the insulating layer hole 119, a lower end portion thereof is connected to the pad 21 of the tester 20 placed below the inelastic electro-conductive housing 112, and an upper end thereof may be connected to the terminal 11 of the device 10 under inspection placed above the inelastic electro-conductive housing 112.

The ground terminal 124 passes through the insulating layer 116 formed on the lower surface of the inelastic electro-conductive housing 112 such that it may come into contact with the ground electrode 22 provided in the tester 20, thereby being connected to the inelastic electro-conductive housing 112. A lower surface of the ground terminal 124 is preferably on the same plane as the lower surface of the inelastic electro-conductive part 120, and the ground terminal is electrically connected to the inelastic electro-conductive housing 112 and a ground electrode 22 provided in the tester 20.

The ground terminal 124 may be formed to have a configuration in which a plurality of electro-conductive particles are contained in an elastic insulating material, like the electro-conductive part 120, or may be made of another electro-conductive material.

A second test socket 210 according to another embodiment of the present disclosure has the same configuration as that of the first test socket 110 except that the electro-conductive part 120 has a protrusion 125 protruding from the lower surface of the inelastic electro-conductive housing 112.

The protrusion 125 of the electro-conductive part 120 protruding from the lower surface of the inelastic electro-conductive housing 112 has a relatively high degree of freedom because it does not have a portion held by the inelastic electro-conductive housing 112. Therefore, if the protrusion 125 of the electro-conductive part is designed to have an appropriate length, it is possible to induce a fine movement of the test socket when the device 10 under inspection comes into contact therewith. In addition, if the test socket is finely moved in all directions when the device 10 under inspection comes into contact therewith, it is possible to obtain an effect of distributing a load caused by the contact between the test socket and the device 10 under inspection and of buffering an impact.

A third test socket 310 according to another embodiment of the present disclosure differs from the first test socket 110 in that, instead of the insulating layer 116, an upper insulating sheet 242 is coupled to the upper surface of the inelastic electro-conductive housing 112, in that, instead of the insulating layer 116, a lower insulating sheet 226 is also coupled to the lower surface of the inelastic electro-conductive housing 112, and in that the electro-conductive part 121 for the signal, the electro-conductive part 122 for power, and an insulating part 216 insulating these electro-conductive parts from the inelastic electro-conductive housing 112 are simultaneously formed. A rest configuration of the third test socket is the same as the corresponding configuration of the first test socket 110.

The plurality of electro-conductive parts 121 for signal and electro-conductive parts 122 for power supported by the insulating part 216 to pass through the inelastic electro-conductive housing 112 in the thickness direction may be formed by filling the plurality of housing holes 113 with an electro-conductive particle mixture containing electro-conductive particles in an elastic insulating material and by placing a magnet smaller than a width of the housing hole 113 at a position corresponding to each housing hole 113 and applying a magnetic field to the electro-conductive particle mixture. That is, the electro-conductive particles in the electro-conductive particle mixture are gathered at a center of the housing hole 113 by the magnetic field of the magnet and are aligned in the thickness direction of the inelastic electro-conductive housing 112, so the electro-conductive part 121 for signal and the electro-conductive part 122 for power are formed, only the elastic insulating material is remained around the electro-conductive part 121 for signal and the electro-conductive part 122 for power, and this elastic insulating material is cured to form the insulating part 216.

The lower insulating sheet 226 is made of an insulating material and covers the lower surface of the inelastic electro-conductive housing 112. The lower insulating sheet 226 serves to prevent a short circuit defect in which the lower surface of the inelastic electro-conductive housing 112 comes into contact with the pad 21 of the tester 20. A plurality of lower insulating sheet holes 227 into which the electro-conductive part 120 or the ground terminal 124 are inserted are formed in the lower insulating sheet 226. In addition, the lower insulating sheet 226 is provided with a lower insulating sheet guide hole 228 passing through the lower insulating sheet 226 in the thickness direction. A guide pin for coupling the third test socket 310 with another member may be inserted into the lower insulating sheet guide hole 228. The third test socket 310 and other members such as a guide housing may be coupled to each other in an aligned state and in a method by which the guide pin is inserted in to the lower insulating sheet guide hole 228.

The support frame 114 is coupled to one surface of the lower insulating sheet 226. The support frame 114 is provided with a support frame guide hole 115 that is in fluid communication with the lower insulating sheet guide hole 228.

The upper insulating sheet 242 is made of an insulating material, and is provided with a plurality of upper insulating sheet holes 243 formed therein and at positions corresponding to the plurality of electro-conductive parts 120. The upper insulating sheet 242 may electrically insulate the inelastic electro-conductive housing 112 from the device 10 under inspection placed above the inelastic electro-conductive housing.

Therefore, in the third test socket 310 according to the present disclosure, since the electro-conductive part 120 and the insulating part 216 may be formed simultaneously in one manufacturing process, the manufacturing process is simplified, and since the upper insulating sheet hole 243 functions as a guide for guiding the terminal 11 of the test device 10 under inspection to the electro-conductive part 120, contact stability is improved. Of course, if the upper insulating sheet hole 243 has a tapered shape in which a diameter thereof is increased in the direction towards the terminal 11 of the device 10 under inspection, the terminal 11 can be more easily guided.

A fourth test socket 410 according to another embodiment of the present disclosure differs from the third test socket 310 described above in that the electro-conductive part 120 has the protrusion 125 protruding from the lower surface 125 of the inelastic electro-conductive housing. A rest configuration of the fourth test socket is the same as the corresponding configuration of the third test socket 310.

Accordingly, the fourth test socket 410 has the effect of distributing the load caused by a contact between the test socket and the device 10 under inspection and of buffering the impact.

A fifth test socket 510 according to another embodiment of the present disclosure differs from the fourth test socket 410 described above in that the electro-conductive part 120 is also disposed in the upper insulating sheet hole 243 of the upper insulating sheet 242. A rest configuration of the fifth test socket is the same as the corresponding configuration of the fourth test socket 410.

In the test sockets 110, 210, 310, 410 and 510 according to the embodiments of the present disclosure, the inelastic electro-conductive housing 112 support the plurality of electro-conductive parts 120 electrically connecting the pad 21 of the tester 20 and the terminal 11 of the device 10 under inspection, so when pressurized towards the tester 20 by the pusher 130, the inelastic electro-conductive housing 112 comes into contact with the tester 20 to function as a stopper.

As shown in FIG. 7 (FIG. 7 exemplarily illustrates that the first test socket 110 is mounted to the tester 20), when the pusher 130 pressurizes the device 10 under inspection towards the test socket 110 through a pressurizing part 140 and a buffering part 150, and the terminal 11 of the device 10 under inspection is pressed against the upper end portion of the electro-conductive part 120 and the lower end portion of the electro-conductive part 120 is pressed against the pad 21 of the tester 20. At this time, a signal generated from the tester 20 is transmitted to the device 10 under inspection through the test socket 110, 210, 310, 410 or 510, so that an electrical test for the device 10 under inspection can be performed.

When the terminal 11 of the device 10 under inspection is pressed against the electro-conductive part 120 of the test socket 110, 210, 310, 410 or 510, since the electro-conductive part 120 has elasticity, the terminal 11 enters inside the housing hole 113 while elastically deforming the electro-conductive part 120. At this time, a lower surface of the device 10 under inspection test 10 may come into contact with the upper surface of the inelastic electro-conductive housing 112. In addition, the lower surface of the inelastic electro-conductive housing 112 comes into contact with an upper surface of the tester 20 by a pressurizing force with which the device 10 under inspection pressurizes the test socket 110, 210, 310, 410 or 510. As the lower surface of the inelastic electro-conductive housing 112 touches the upper surface of the tester 20, a stroke is not further increased.

In this way, as the lower surface of the device 10 under inspection comes into contact with the upper surface of the inelastic electro-conductive housing 112 to pressurize the test socket 110, 210, 310, 410 or 510 towards the tester 20, a pressurizing force applied to the device 10 under inspection may be evenly transmitted to the entire test socket 110, 210, 310, 410 or 510, and the plurality of electro-conductive parts 120, the plurality of pads 21 and the plurality of terminals 11 may be maintained in a contact state with an entirely uniform contact force. Therefore, the plurality of pads 21 and the plurality of terminals 11 may be maintained in a stable connection state through the test socket 110, 210, 310, 410 or 510, so no signal transmission loss occurs and it is possible to perform a stable test.

In other words, in the test apparatus 100 according to an embodiment of the present disclosure, the inelastic electro-conductive housing 112 of each of the test sockets 110, 210, 310, 410 and 510 serves as a stopper. Like a conventional technique utilizing a rubber socket type test socket, accordingly, difficulty in stroke control due to a thickness tolerance of a stroke limiting part, a thickness tolerance of a stopper part of the test socket, a height tolerance of the test socket, a thickness tolerance of the device under test, or the like is reduced, and it is possible to precisely control of the stroke. In addition, life characteristics of the test sockets 110, 210, 310, 410 and 510 may be improved by precise control of the stroke.

In addition, in the test sockets 110, 210, 310, 410 and 510 according to the embodiment of the present disclosure, as shown in FIG. 8, the insulating layer 116 or the insulating part 216 surrounds the electro-conductive part 121 for transmitting a signal and the inelastic electro-conductive housing 112 surrounds a periphery of the insulating layer 116 or the insulating part 216, so each test socket has a coaxial structure. Accordingly, a high frequency signal transmission characteristic is excellent and high frequency signal interference between the electro-conductive parts 121 for signal is small, so the signal transmission loss can be minimized.

In addition, in the test sockets 110, 210, 310, 410 and 510 according to embodiments of the present disclosure, a characteristic impedance matching is possible by adjusting a diameter of the electro-conductive part 121 for signal or a distance between the electro-conductive part 121 for signal and the inelastic electro-conductive housing 112, so the above sockets are advantageous for high-speed signal transmission. Furthermore, in the test sockets 110, 210, 310, 410 and 510 according to embodiments of the present disclosure, as the insulating layer 116 or the insulating part 216 surrounds the electro-conductive part 122 for power, an occurrence of an electrical short is prevented.

Each of the test sockets 110, 210, 310, 410 and 510 according to embodiments of the present disclosure is formed to have a configuration in which the inelastic electro-conductive housing 112 surrounds the electro-conductive part 121 for signal, the electro-conductive part 122 for power and the electro-conductive part 123 for grounding to form a coaxial structure which is advantageous for high-frequency signal transmission. In order to form the coaxial structure, the ground terminal 124 formed on the lower surface of the inelastic electro-conductive housing 112 is connected to the ground electrode 22 of the tester 20 to be grounded. In order to have more improved high-frequency signal transmission and power supply characteristic, however, it is necessary to form the electro-conductive part 123 for grounding so as to be connected to the pad 21 of the tester 20 and, to make the electro-conductive part 123 for grounding come into contact with the inelastic electro-conductive housing 112 made of a metal material.

In the present disclosure, the electro-conductive part 123 for grounding is formed by applying a magnetic field to an elastic insulating material containing a plurality of electro-conductive particles in the thickness direction of the inelastic electro-conductive housing 112 so as to orient the electro-conductive particles in the thickness direction and then curing the electro-conductive particles, and when the terminal 11 of the device 10 under inspection pressurizes the electro-conductive part 123 for grounding, the electro-conductive particles in the electro-conductive part 123 for grounding are connected to each other in the thickness direction to form an electro-conductive path.

As described above, since the electro-conductive part 123 for grounding has the plurality of electro-conductive particles contained in the elastic insulating material, the elastic insulating material may be interposed between the electro-conductive particles aligned in the thickness direction and the inelastic electro-conductive housing 112, so the electro-conductive particles aligned in the thickness direction and the inelastic electro-conductive housing 112 may not be properly connected to each other. In addition, when the electro-conductive part 123 for grounding is pressurized, the electro-conductive particles are aligned in the thickness direction, that is, in the vertical direction to form an electro-conductive path, and as a result, a contact between the inelastic electro-conductive housing 112 located on the side and the electro-conductive part for grounding may not be made well. Furthermore, when the electro-conductive part 123 for grounding is pressed, the connection may be broken as the electro-conductive path aligned in the vertical direction is widened in the middle to the side, and in particular, when the electro-conductive path becomes longer, this phenomenon occurs more frequently.

Therefore, in the present disclosure, a ground-connecting end part 1121 is provided in the housing hole 113 in which the electro-conductive part 123 for grounding is disposed and provided between upper and lower end portion of the housing hole 113. Specifically, this ground-connecting end part 1121 is formed by protruding the inelastic electro-conductive housing 112 from an inner wall forming the housing hole 113, and allows the electro-conductive part 123 for grounding to come into contact with the inelastic electro-conductive housing 112 more securely.

Figure 5:
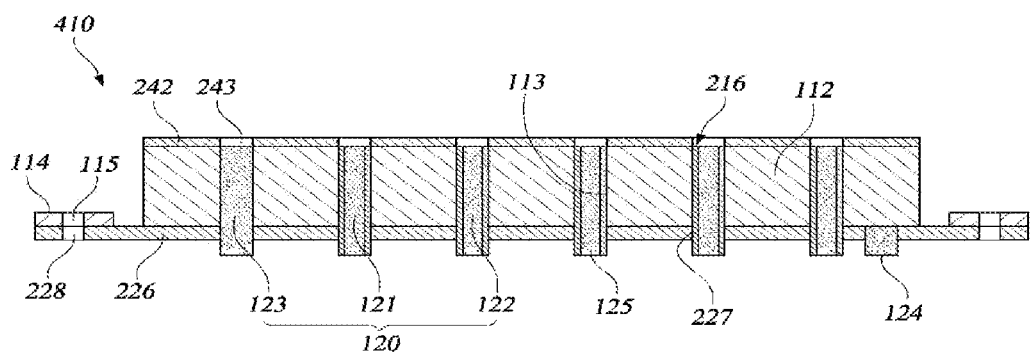
Figure 6:
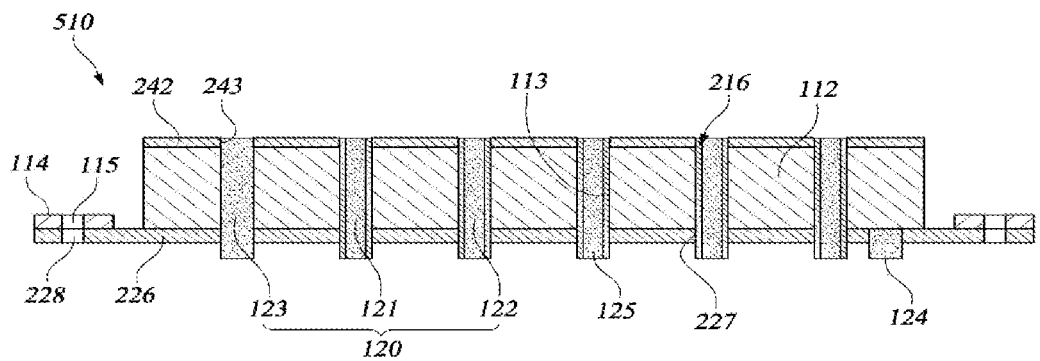
Figure 9:
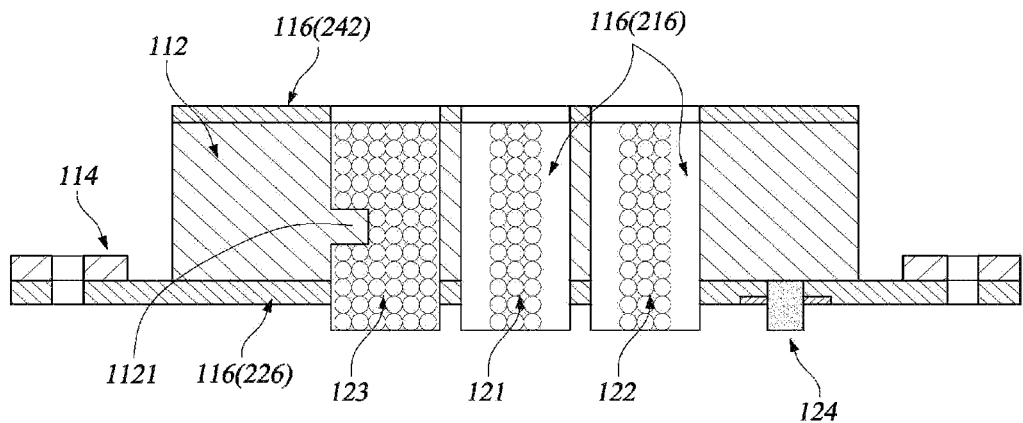
FIG. 9 is a view exemplarily illustrating, in the test socket shown in FIG. 5 according to the present disclosure, a configuration in which one electro-conductive part for signal, one electro-conductive part for power, and one electro-conductive part for grounding are disposed, and a ground-connecting end part is formed.

FIG. 9 illustrate that, for convenience of explanation, the ground-connecting end part 1121 of the present disclosure is formed in the test socket 410 shown in FIG. 5 in which one electro-conductive part 121 for signal, one electro-conductive part 122 for power and one electro-conductive part 123 for grounding are disposed. Although spherical electro-conductive particles are exemplarily illustrated in FIG. 9 for convenience, it should be noted that the electro-conductive particles of the present disclosure may be spherical or other regular shaped electro-conductive particles, or uneven irregular shaped electro-conductive particles.

FIGS. 9 to 13 depict the plate-shaped ground-connecting end parts 1121 having various configuration and formed at various positions. Although the housing hole 113 formed in the inelastic electro-conductive housing 112 has the shape of a through hole without an upper surface and a lower surface, in the present disclosure, in order to explain the positional relationship of the housing hole 113, surfaces covering upper and lower portions of the housing hole 113 may be defined as an upper surface and a lower surface of the housing hole 113, respectively. FIG. 9 illustrates that the ground-connecting end part 121 is formed in a plate shape extending towards a center of the housing hole 113.

By forming the ground-connecting end part 1121, which protrudes from the inelastic electro-conductive housing 112, between upper and lower portions of the electro-conductive part 123 for grounding, when the terminal 11 of the device 10 under inspection pressurizes the electro-conductive part 123 for grounding from top to bottom, the electro-conductive particles are connected to the ground-connecting end part 1121 formed on and protruding from the inelastic electro-conductive housing 112. In addition to the above, an electro-conductive path in which the electro-conductive particles in the elastic insulating material are aligned in the vertical direction is also formed at a periphery of the ground-connecting end part 1121 at the same time, so a pressurizing force of the terminal 11 of the device 10 under inspection is stably transmitted to the pad 21 of the tester 20, which is located below the device under test, and a connection between the device under test and the tester 20 can be thus made more stably.

Figure 10:
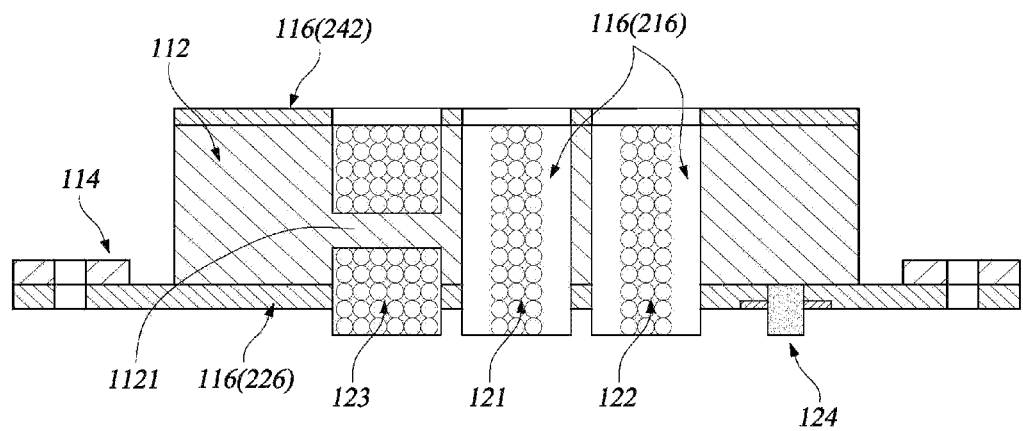
FIGS. 10 to 13 are views illustrating plate-shaped ground-connecting end parts having various configurations and formed at various positions.

FIG. 10 illustrates that the ground-connecting end part 1121 is formed in a shape of a plate traversing the housing hole 113. If the electro-conductive part 123 for grounding is formed in a cylindrical shape, the ground-connecting end part 1121 of FIG. 10 has a disk shape, and if the electro-conductive part for grounding has a square pillar shape, the ground-connecting end part has a square plate shape. That is, the ground-connecting end part may have a variety of shapes depending on a cross-section of the electro-conductive part 123 for grounding.

By forming the ground-connecting end part 1121, which protrudes from the inelastic electro-conductive housing 112 and traverses the housing hole 113, between upper and lower portions of the electro-conductive part 123 for grounding, when the terminal 11 of the device 10 under inspection pressurizes the electro-conductive part 123 for grounding from top to bottom, the electro-conductive particles are connected to upper and lower surfaces of the ground-connecting end part 1121, so there is an effect that a connection between the electro-conductive part 123 for grounding and the inelastic electro-conductive housing 112 is reliably made by a pressurizing force of the terminal 11 of the device 10 under inspection.

Figure 11:
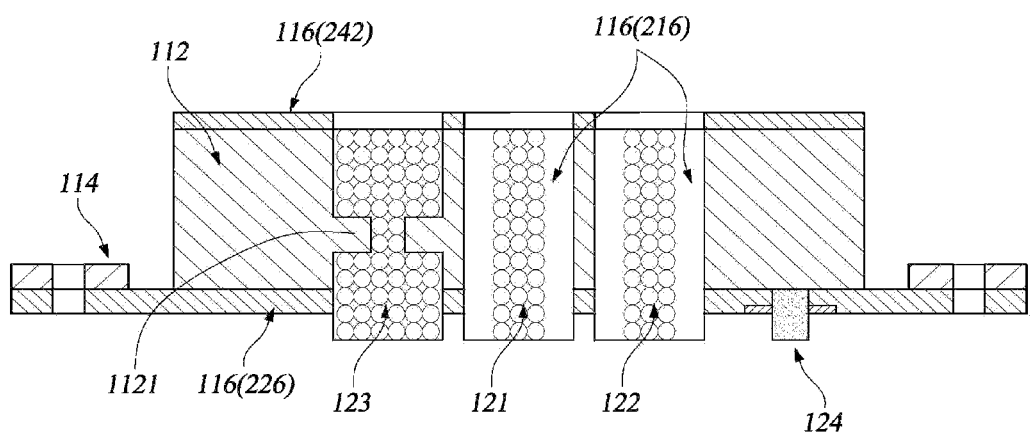

FIG. 11 shows a configuration in which a through hole is formed in a central portion of the ground-connecting end part 1121 shown in FIG. 10. In such the configuration of the ground-connecting end part 1121, an elector-conductive path in which the electro-conductive particles in the elastic insulating material are aligned in the vertical direction through the through-hole is also formed at the same time, so the pressurizing force of the terminal 11 of the device 10 under inspection can be stably transmitted to the pad 21 of the tester 20, which is located below the device under test. In addition to the advantage of the ground-connecting end part 1121 shown in FIG. 10, as a result, the ground-connecting end part 1121 of FIG. 11 has the effect of stably connecting the device 10 under inspection and the tester 20.

On the other hand, on an upper surface of the ground-connecting end part 1121 shown in FIGS. 9 to 11, an upper inclined surface 1122 inclined downward from the inner wall of the inelastic electro-conductive housing 112 forming the housing hole may be formed. Alternatively, a lower inclined surface 1123 inclined upward from the inner wall of the inelastic electro-conductive housing 112 forming the housing hole may also be formed on a lower surface of the ground-connecting end part 1121. Of course, the upper inclined surface 1122 and the lower inclined surface 1123 may be simultaneously formed on the upper and lower surfaces of the ground-connecting end part 1121, respectively.

Figure 12:
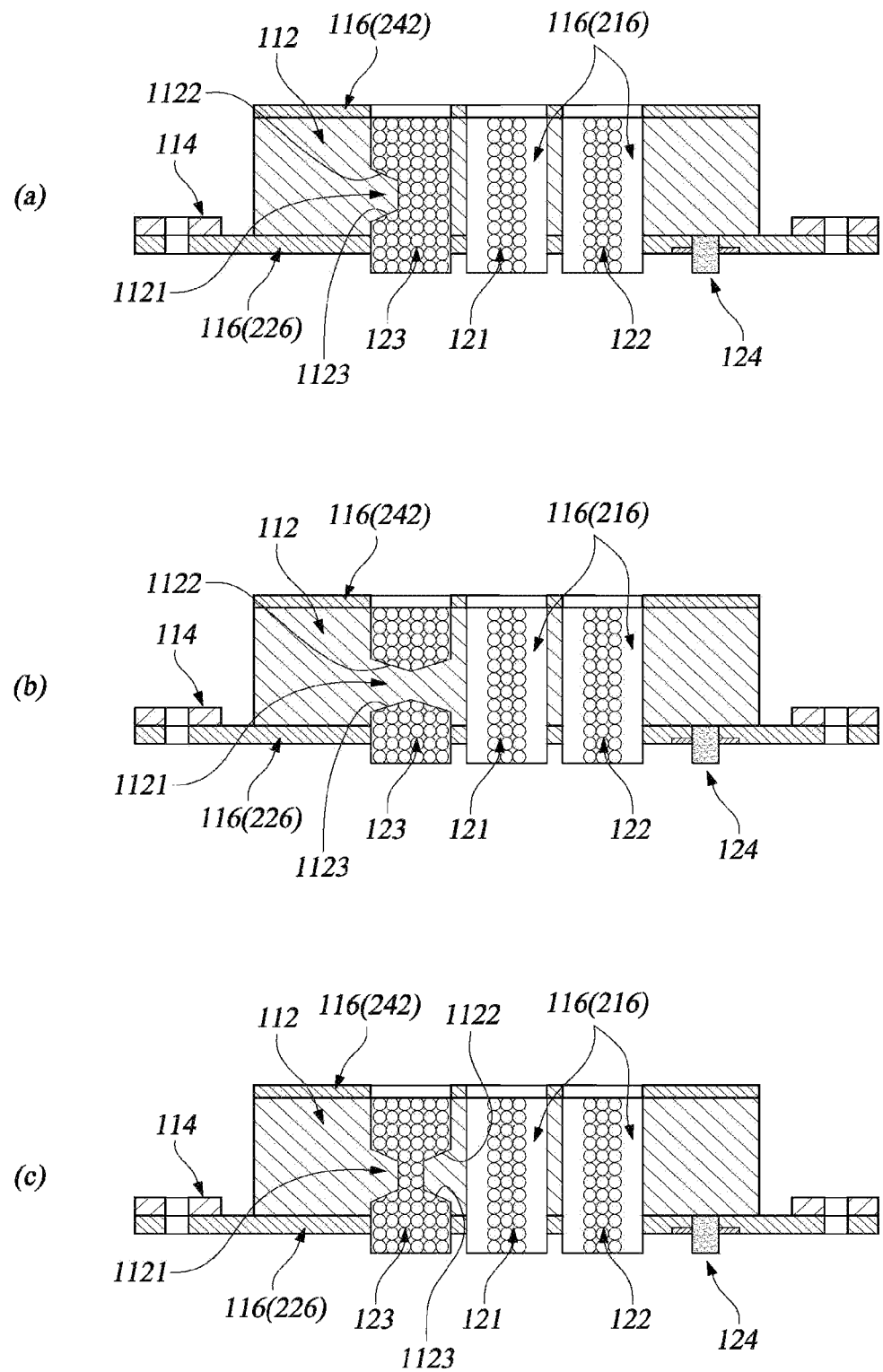

FIG. 12 illustrates configurations in which the upper inclined surface 1122 and the lower inclined surface 1123 are simultaneously formed on the upper and lower surfaces of the ground-connecting end part 1121 having the configurations shown FIGS. 9 to 11.

If the upper inclined surface 1122 and the lower inclined surface 1123 are formed on the ground-connecting end part 1121 as described above, when the terminal 11 of the device 10 under inspection pressurize the electro-conductive part 123 for grounding from top to bottom, the electro-conductive particles present above the ground-connecting end part 1121 are slid downward towards a lower portion of the upper inclined surface 1122 and the electro-conductive particles present below the ground-connecting end part 1121 are slid upward towards an upper portion of the lower inclined surface 1123, so a connection between the electro-conductive particle and the ground-connecting end part 1121 can be made more stably. Therefore, if the inclined surfaces are formed on both surfaces of the ground-connecting end part 1121, a much more stable connection is possible as compared with the inclined surface being provided on only one surface. For this reason, it is more preferable that the upper inclined surface 1122 and the lower inclined surface 1123 are simultaneously formed on the upper surface and the lower surface of the ground-connecting end part 1121.

In addition, when a part of the electro-conductive part 123 for grounding in which electro-conductive particles are contained in the elastic insulating material is disposed at an upper end portion or a lower end portion of the housing hole 113 of the inelastic electro-conductive housing 112, the ground-connecting end part 1121 may be formed at a position adjacent to the upper end portion or the lower end portion of the housing hole 113. If a part of the electro-conductive part 123 for grounding in which electro-conductive particles are contained in the elastic insulating material is not disposed at the upper end portion or the lower end portion of the housing hole 113, when the terminal 11 of the device 10 under inspection pressurizes the electro-conductive part 123 for grounding from top to bottom, the terminal 11 of the device 10 under inspection or the pad 21 of the tester 20 comes into direct contact with the ground-connecting end part 1121 protruding from the inelastic electro-conductive housing 112, so the terminal or the pad may be damaged. Therefore, it is preferable to form the ground-connecting end part 1121 at a position adjacent to the upper end portion or the lower end portion of the housing hole 113 only when the terminal 11 or the pad 21 can elastically come into contact with the electro-conductive part 123 for grounding.

Figure 13:
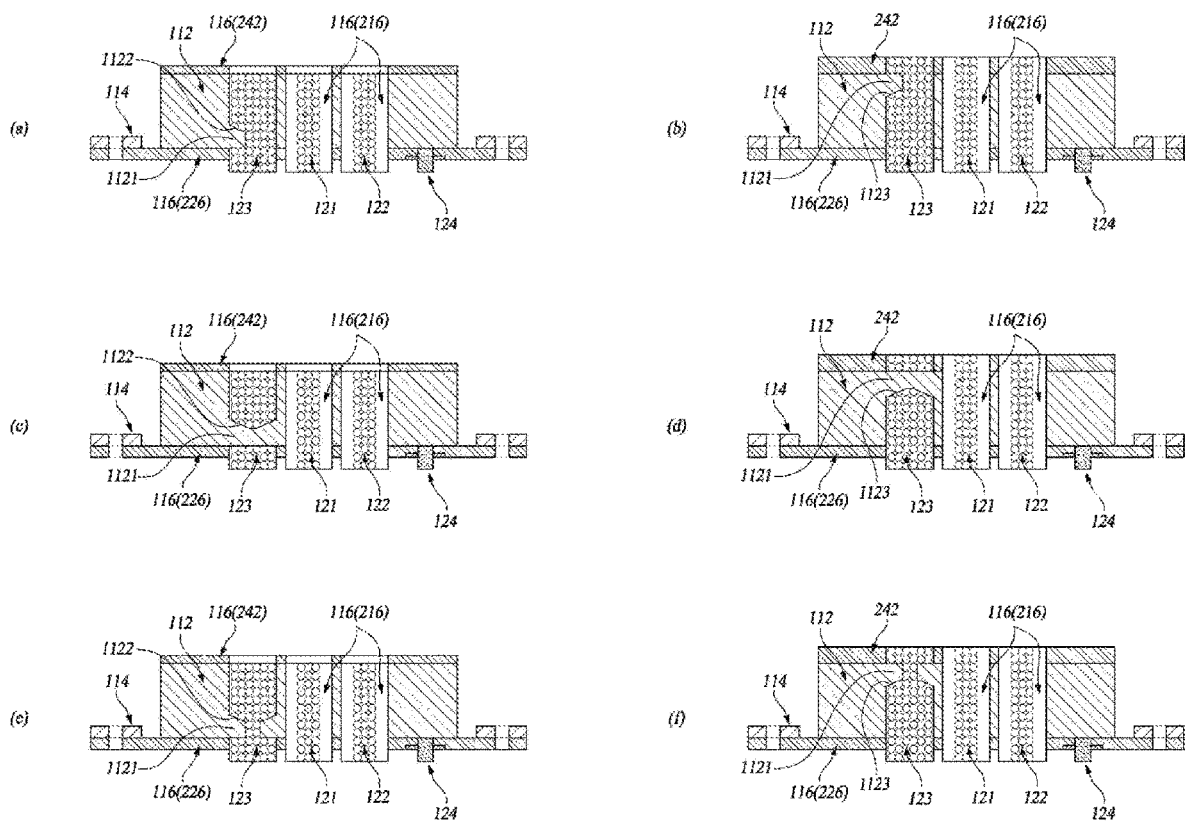

FIG. 13 illustrates that the ground-connecting end part 1121 according to the present disclosure is formed at a position adjacent to the upper end portion or the lower end portion of the housing hole 113.

FIG. 13(a) shows a configuration in which the ground-connecting end part 1121 of FIG. 9, which is formed in a plate shape extending towards a center the housing hole 113, is formed at a position adjacent to the lower end portion of the housing hole 113, and FIG. 13(b) shows a configuration in which the above ground-connecting end part 1121 is formed at a position adjacent to the upper end portion of the housing hole 113.

As illustrated in the above drawings, when the ground-connecting end part 1121 is disposed at a position adjacent to the upper end portion or the lower end portion of the housing hole 113, in order to sufficiently secure a portion of the ground-connecting end part 1121 with which the terminal 11 of the device 10 under inspection or the pad 21 of the tester 20 can elastically come into contact, It is preferable not to provide an inclined surface on the surface of the ground-connecting end part 1121 corresponding to the terminal 11 of the device 10 under inspection or the pad 21 of the tester 20, but to form an inclined surface only on an opposite surface.

In addition, it can be seen that when the ground-connecting end part 1121 is disposed at a position adjacent to the upper or lower end portion of the housing hole 113, a portion of the electro-conductive part 123 for grounding is disposed in the upper insulating sheet hole 243 of the upper insulating sheet 242 placed above the ground-connecting end part or a portion of the electro-conductive part 123 for grounding is disposed in the lower insulating sheet hole 227 of the lower insulating sheet 226 placed below the ground-connecting end part. That is, in the case of the test socket in which a part of the electro-conductive part 123 for grounding is not disposed at the upper or lower end portion of the housing hole 113 of the inelastic electro-conductive housing 112, the ground-connecting end part 1121 is not formed at a position adjacent to the upper or lower end portion of the housing hole 113 of the inelastic electro-conductive housing 112.

FIG. 13(c) shows a configuration in which the ground-connecting end part 1121 of FIG. 10, which is formed in a plate shape traversing the housing hole 113, is formed at a position adjacent to the lower end portion of the housing hole 113, and FIG. 13(d) shows a configuration in which the above ground-connecting end part 1121 is formed at a position adjacent to the upper end portion of the housing hole 113.

FIG. 13(e) shows a configuration in which the ground-connecting end part 1121 of FIG. 11, which is formed in a plate shape traversing the housing hole 113 and has a through hole formed at a center thereof, is formed at a position adjacent to the lower end portion of the housing hole 113, and FIG. 13(f) shows a configuration in which the above ground-connecting end part 1121 is formed at a position adjacent to the upper end portion of the housing hole 113.

FIG. 13 shows that the ground-connecting end part 1121 is formed only at one position adjacent to the upper or lower end portion of the housing hole 113, but the ground-connecting end parts 1121 may be formed at both positions adjacent to the upper and lower end portions of the housing hole 113, respectively. In addition, the ground-connecting end parts 1121 may be formed at a position adjacent to the upper or lower end portion of the housing hole 113 and a position between the upper end portion and the lower end portion.

Therefore, in the test socket according to the present disclosure, since the electro-conductive part 123 for grounding comes into direct contact with the ground-connecting end part 1121 protruding from the inelastic electro-conductive housing 112 formed of a metal material, and is connected to the pad 21 of the tester 20, electromagnetic wave shielding function and grounding function are improved, so the signal transmission and power supply characteristics with improved high frequency characteristics and strong resistance to high frequency noise may be obtained.

Although preferred examples of the present disclosure have been described above, the scope of the present disclosure is not limited to the forms described and illustrated above.

For example, the insulating layer applied on the inelastic electro-conductive housing is formed only around the housing holes in which the electro-conductive part for signal and the electro-conductive part for power are disposed respectively, and instead of the insulating layer, the upper insulating sheet and the lower insulating sheet may be coupled to the upper and lower surfaces of the inelastic electro-conductive housing, respectively. Furthermore, although the electro-conductive part having the protrusion protruding towards a lower portion of the inelastic electro-conductive housing has been illustrated and described, it is possible to form the electro-conductive part having a protrusion protruding to an upper portion of the inelastic electro-conductive housing, and the electro-conductive part having an upper protrusion together with a lower protrusion may also be employed.

While the present disclosure has been described with reference to the embodiments illustrated in the figures, the embodiments are merely examples, and it will be understood by those skilled in the art that various changes in form and other embodiments equivalent thereto can be performed. Therefore, the technical scope of the disclosure is defined by the technical idea of the appended claims The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:
1. A test socket comprising;
an inelastic electro-conductive housing formed of an inelastic electro-conductive material and provided with a plurality of housing holes passing therethrough in the thickness direction, each housing hole being formed at a position corresponding to each terminal of a device under test; and
an electro-conductive part formed to have a configuration in which a plurality of electro-conductive particles are oriented in the thickness direction in an elastic insulating material, and comprising an electro-conductive part for grounding, an electro-conductive part for signal, and an electro-conductive part for power disposed in the housing holes, respectively, the electro-conductive part for signal and the electro-conductive part for power being insulated by an insulating layer,
wherein a ground-connecting end part is provided in the housing hole in which the electro-conductive part for grounding is disposed, provided between an upper and lower end portions of the housing hole, and formed by protruding the inelastic electro-conductive housing from an inner wall forming the housing hole.
2. The test socket of claim 1, wherein the ground-connecting end has a plate shape extending towards a center of the housing hole.

3. The test socket of claim 1, wherein the ground-connecting end part has a plate shape traversing the housing hole.

4. The test socket of claim 3, wherein the ground-connecting end part has a through hole formed at a center thereof.

5. The test socket of claim 2, wherein an upper surface of the ground-connecting end part is formed as an upper inclined surface inclined downward from an inner wall of the inelastic electro-conductive housing forming the housing hole.

6. The test socket of claim 2, wherein a lower surface of the ground-connecting end part is formed as a lower inclined surface inclined upward from an inner wall of the inelastic electro-conductive housing forming the housing hole.

7. The test socket of claim 2, wherein an upper surface of the ground-connecting end part is formed as an upper inclined surface inclined downward from an inner wall of the inelastic electro-conductive housing forming the housing hole, and a lower surface of the ground-connecting end part is formed as a lower inclined surface inclined upward from an inner wall of the inelastic electro-conductive housing forming the housing hole.

8. The test socket of claim 1, wherein the insulating layers are formed on upper and lower surfaces of the inelastic electro-conductive housing, respectively.

9. A test socket comprising;
an inelastic electro-conductive housing formed of an inelastic electro-conductive material and provided with a plurality of housing holes passing therethrough in the thickness direction, each housing hole being formed at a position corresponding to each terminal of a device under test;
an upper insulating sheet and a lower insulating sheet coupled to upper surface and lower surface of the inelastic electro-conductive housing, respectively, each of the upper insulating sheet and the lower insulating sheet having an insulation sheet hole formed therein and corresponding to the housing hole; and
an electro-conductive part formed to have a configuration in which a plurality of electro-conductive particles are oriented in the thickness direction in an elastic insulating material, and comprising an electro-conductive part for grounding passing through and disposed in the housing hole and insulation sheet hole, and an electro-conductive part for signal and an electro-conductive part for power passing through and disposed in the housing hole and insulation sheet hole in which insulating parts are formed,
wherein a ground-connecting end part is provided in the housing hole in which the electro-conductive part for grounding is disposed, and formed by protruding the inelastic electro-conductive housing from an inner wall forming the housing hole.

10. The test socket of claim 9, wherein the ground-connecting end part is formed at a position adjacent to an upper end portion of the housing hole.

11. The test socket of claim 9, wherein the ground connecting end part is formed at a position adjacent to a lower end portion of the housing hole.

12. The test socket of claim 9, wherein the insulating part is made of an elastic insulating material.

13. The test socket of claim 1, wherein a ground terminal connected to the inelastic electro-conductive housing is disposed on a lower surface of the inelastic electro-conductive housing.

14. The test socket of claim 9, wherein a ground terminal connected to the inelastic electro-conductive housing is disposed on a lower surface of the inelastic electro-conductive housing.

15. The test socket according to claim 13, wherein the ground terminal is formed to have a configuration in which a plurality of electro-conductive particles are contained in an elastic insulating material.

16. The test socket according to claim 14, wherein the ground terminal is formed to have a configuration in which a plurality of electro-conductive particles are contained in an elastic insulating material.

17. A test apparatus configured to connect a device under test having a terminal to a tester generating a test signal so as to test the device under test, the test apparatus comprising:
a test socket configured to electrically connect the tester and the device under test to each other so to enable the test signal of the tester to be transmitted the device under test; and
a pusher configured to be moved towards the tester or away from the tester so as to provide a pressurizing force by which the device under test placed on the test socket can be pressurized toward the tester,
wherein the test socket comprising:
an inelastic electro-conductive housing formed of an inelastic electro-conductive material and provided with a plurality of housing holes passing therethrough in the thickness direction, each housing hole being formed at a position corresponding to each terminal of a device under test;
insulating layers formed on upper and lower surfaces of the inelastic electro-conductive housing, respectively; and
an electro-conductive part formed to have a configuration in which a plurality of electro-conductive particles are oriented in the thickness direction in an elastic insulating material, and comprising an electro-conductive part for grounding, an electro-conductive part for signal, and an electro-conductive part for power disposed in the housing holes, respectively, the electro-conductive part for signal and the electro-conductive part for power being insulated by an insulating layer,
wherein a ground-connecting end part is provided in the housing hole in which the electro-conductive part for grounding is disposed, provided between an upper and lower end portions of the housing hole, and formed by protruding the inelastic electro-conductive housing from an inner wall forming the housing hole.

18. The test apparatus of claim 17, wherein the ground-connecting end has a plate shape extending towards a center of the housing hole.

19. A test apparatus configured to connect a device under test having a terminal to a tester generating a test signal so as to test the device under test, the test apparatus comprising:
a test socket configured to electrically connect the tester and the device under test to each other so to enable the test signal of the tester to be transmitted the device under test; and
a pusher configured to be moved towards the tester or away from the tester so as to provide a pressurizing force by which the device under test placed on the test socket can be pressurized toward the tester,
wherein the test socket comprising:
an inelastic electro-conductive housing formed of an inelastic electro-conductive material and provided with a plurality of housing holes passing therethrough in the thickness direction, each housing hole being formed at a position corresponding to each terminal of a device under test;

an upper insulating sheet and a lower insulating sheet coupled to upper surface and lower surface of the inelastic electro-conductive housing, respectively, each of the upper insulating sheet and the lower insulating sheet having an insulation sheet hole formed therein and corresponding to the housing hole; and an electro-conductive part formed to have a configuration in which a plurality of electro-conductive particles are oriented in the thickness direction in an elastic insulating material, and comprising an electro-conductive part for grounding passing through and disposed in the housing hole and insulation sheet hole, and an electro-conductive part for signal and an electro-conductive part for power passing through and disposed in the housing hole and insulation sheet hole in which insulating parts are formed, wherein a ground-connecting end part is provided in the housing hole in which the electro-conductive part for grounding is disposed, and formed by protruding the inelastic electro-conductive housing from an inner wall forming the housing hole.

20. The test apparatus of claim 19, wherein the ground-connecting end has a plate shape extending towards a center of the housing hole.

* * * * *